(12) United States Patent
Choi et al.

(10) Patent No.: US 8,609,305 B2
(45) Date of Patent: Dec. 17, 2013

(54) METHODS OF FORMING A PHOTOLITHOGRAPHY RETICLE

(75) Inventors: Jin Choi, Seoul (KR); Jin-Ha Jeong, Yongin-si (KR); Urazaev Vladimir, Suwon-si (KR); Hea-Yun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 13/443,440

(22) Filed: Apr. 10, 2012

(65) Prior Publication Data
US 2012/0288787 A1 Nov. 15, 2012

(30) Foreign Application Priority Data

May 9, 2011 (KR) ........................ 10-2011-0043452

(51) Int. Cl.
*G03F 1/78* (2012.01)
*G03F 1/80* (2012.01)

(52) U.S. Cl.
USPC ............... 430/5; 430/296; 430/313; 430/323; 430/942

(58) Field of Classification Search
USPC ............... 430/5, 296, 313, 323, 942
See application file for complete search history.

(56) References Cited

U.S. PATENT DOCUMENTS

| 5,886,357 A | 3/1999 | Kojima |
| 6,555,275 B2 * | 4/2003 | Yang ................................ 430/5 |

FOREIGN PATENT DOCUMENTS

| JP | 3085206 | 7/2000 |
| JP | 3319519 | 6/2002 |
| JP | 3458628 | 8/2003 |

* cited by examiner

*Primary Examiner* — Christopher Young
(74) *Attorney, Agent, or Firm* — Myers Bigel Sibley & Sajovec

(57) ABSTRACT

In a method of forming a reticle and electron beam exposure system, first electron beams are irradiated onto a first region of a blank reticle having a light shielding layer and a photosensitive layer, to form first shot patterns. Second electron beams having a cross-sectional area larger than the first electron beams are irradiated onto a second region of the blank reticle. The photosensitive layer is developed to form first and second mask patterns at the first and second regions, respectively. The light shielding layer is etched off using the first and second mask patterns as an etching mask, thereby forming the mother pattern including a first pattern in the first region and a second pattern in the second region. Accordingly, the enlargement of the second electron beams reduces the scan time for the blank reticle, thereby reducing the process time.

14 Claims, 11 Drawing Sheets

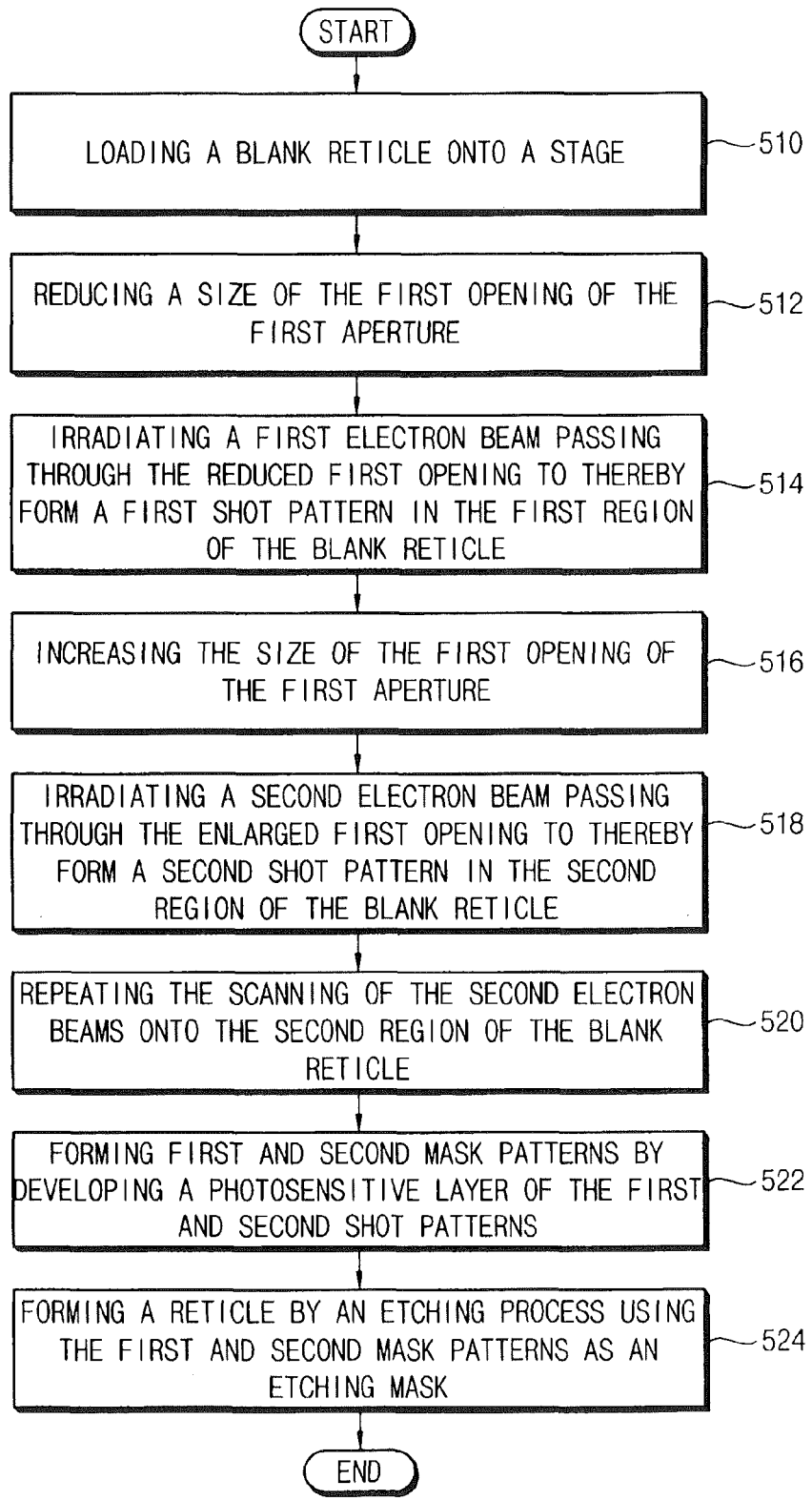

METHODS OF FORMING A PHOTOLITHOGRAPHY RETICLE

CROSS-REFERENCE TO RELATED APPLICATIONS

This application claims the benefit of Korean Patent Application No. 10-2011-0043452 filed on May 9, 2011, in the Korean Intellectual Property Office, the disclosure of which is incorporated herein in its entirety by reference.

BACKGROUND

A conventional photolithography process for semiconductor devices usually requires a reticle for transcribing integrated circuit patterns onto a substrate, and the reticle generally includes various mother patterns that are transcribed into the integrated circuit patterns on the substrate such as a wafer. The mother patterns are usually engraved or embedded onto a quartz substrate by an electron beam exposure system, to thereby form the reticle for the photolithography process. The integrated circuit patterns may include various shapes and sizes such as fine patterns and bulk patterns that may be mutually interconnected with one another at high complexity. For that reason, the engraving of the mother patterns corresponding to the circuit patterns onto the quartz substrate usually needs a large amount of time particularly due to the engraving of the fine patterns. Overall exposure recipes of an electron beam exposure system for engraving the mother patterns onto the quartz may be usually set up in view of the most complicated and fine patterns, and thus the bulk pattern of the mother pattern may also be engraved on the same process conditions as the fine patterns. Therefore, the conventional formation of the reticle may take much time and cost due to the fine and complicated patterns.

SUMMARY

Some embodiments of the present inventive concept include methods of forming a photolithography reticle. Such methods may include irradiating first electron beams having a first cross-sectional area onto a first region of a blank reticle that includes a light shielding layer and a photosensitive layer formed on a reticle substrate, the photosensitive layer of the first region being formed into first shot patterns, and irradiating second electron beams having a second cross-sectional area that is larger than the first cross-sectional area onto a second region of the blank reticle, the photosensitive layer of the second region being formed into second shot patterns. Methods may further include developing the photosensitive layer to form a first mask pattern in the first region and a second mask pattern in the second region of the blank reticle and etching the light shielding layer off from the reticle substrate using the first mask pattern and the second mask pattern as an etching mask to form a mother pattern including a first pattern having a small width in the first region and a second pattern having a large width in the second region.

Some embodiments may include adjusting an opening size of an aperture through which the first electron beams and the second electron beams are transmitted. Some embodiments provide that a first opening size corresponds to the first cross-sectional area and a second opening size that is larger than the first opening size corresponds to the second cross-sectional area. In some embodiments, adjusting the opening size of the aperture includes moving at least one of a pair of first and second overlapping sections relative to one another.

Some embodiments include, before irradiating the first electron beams onto the first region of the blank reticle, adjusting an opening size of an aperture through which the first electron beams transmit to a first size corresponding to the first cross-sectional area of the first electron beams, and, before irradiating the second electron beams onto the second region of the blank reticle, adjusting the opening size of the aperture through which the second electron beams transmit to a second size that is larger than the first size corresponding to the second cross-sectional area of the second electron beams.

Some embodiments provide that adjusting the opening of the aperture is performed by a pair of first and second sections relatively moving to partially overlap with each other.

In some embodiments, the first and the second beams are periodically and intermittently irradiated for an emission time that occurs at an interval determined by a stopping time for which the irradiation of the first and second electron beams is stopped, so that the first and the second shot patterns are individually formed at each emission time. Some embodiments provide that the second electron beams are irradiated onto a larger shot area of the photosensitive layer than the first electron beams, so that the second shot patterns are formed to be larger than the first shot patterns. In some embodiments, the first pattern is transcribed into a fine pattern having a first width in a semiconductor device, the second pattern is transcribed into a bulk pattern having a second width in the semiconductor device, and the first width is a small width and the second width is a large width. Some embodiments provide that the first width is substantially smaller than the second width.

Some embodiments provide that irradiating the first and the second electron beams is sequentially performed on a whole area of the first and the second regions of the blank reticle, respectively, to complete a beam scan of the first and the second electron beams onto the first and the second regions, respectively. In some embodiments, the beam scan of the first and the second electron beams is repeated without changes of exposure conditions. Some embodiments include, after completing the beam scan of the second electron beams on the second region of the blank reticle, irradiating third electron beams onto marginal portions of the second shot patterns, thereby forming third shot patterns covering marginal portions of the neighboring second shot patterns. In some embodiments, the third electron beams have a third cross-sectional area that is substantially identical to the second cross-sectional area, and the second electron beams and the third electron beams include substantially the same bean intensities and beam intensity uniformity.

In some embodiments, an intensity uniformity of the second electron beams is less than that of the first electron beams.

Some embodiments of the present inventive concept include an electron beam exposure system that includes an electron gun that is operable to generate electron beams, a first aperture having a size-variable opening through which the electron beams partially transmit, a first lens that is operable to control a path of the electron beams having passed through the first aperture, a second aperture having a size-fixed opening through the electron beams reflected from the second lens partially transmit, and a second lens that is operable to control a path of the electron beams having passed through the second aperture.

Some embodiments provide that the first aperture includes an 'L'-shaped first section and a '⌐'-shaped second section facing the first section such that the first and the second sections are overlapped, thereby forming the size-variable opening of the first aperture.

In some embodiments, the first aperture includes a first section having a preliminary opening at a central portion thereof and a '⌐'-shaped second section overlapped with the first section such that a marginal portion of the preliminary opening is overlapped with the second section. Some embodiments provide that the size-variable opening of the first aperture is formed corresponding to residuals of the preliminary opening that is uncovered with the second section.

In some embodiments, the first aperture includes a first section having a preliminary opening at a central portion thereof and a rectangular plate-shaped second section overlapped with the first section such that a portion of the preliminary opening is overlapped with the second section. In some embodiments, the size-variable opening of the first aperture is formed corresponding to residuals of the preliminary opening that is uncovered with the second section.

According to some example embodiments, there is provided a method of forming a reticle including a mother pattern. A blank reticle is loaded onto a stage. The blank reticle may include a reticle substrate and a light shielding layer and a photosensitive layer that may be sequentially staked on the reticle substrate. First electron beams may be irradiated onto a first region of the blank reticle, thereby forming the photosensitive layer of the first region into first shot patterns. Second electron beams having a cross-sectional area larger than the first electron beams may be irradiated onto a second region of the blank reticle, thereby forming the photosensitive layer of the second region into second shot patterns. The photosensitive layer of the first and the second regions of the blank reticle by a developing process, thereby forming first and second mask patterns at the first and second regions of the blank reticle, respectively. The light shielding layer may be etched off from the reticle substrate using the first and second mask patterns as an etching mask, thereby forming the mother pattern including a first pattern having a small width in the first region and a second pattern having a large width in the second region.

In some embodiments, an opening of an aperture may be reduced before the first electron beams may be irradiated onto the first region of the blank reticle, and thus the first electron beams may have relatively high density uniformity after transmitting the aperture. In addition, the opening of the aperture may be enlarged before the second electron beams may be irradiated onto the second region of the blank reticle, and thus the second electron beams transmits the opening of the aperture larger than the first electron beams transmits and may have relatively low density uniformity after transmitting the aperture.

In some embodiments, the opening of the aperture may be reduced or enlarged by a pair of first and second sections relatively moving to partially overlap with each other.

In some embodiments, the first and the second beams are periodically and intermittently irradiated for an emission time at an interval of a stopping time for which the irradiation of the first and second electron beams is stopped, so that the first and the second shot patterns are individually formed at each emission time.

In some embodiments, the second electron beams are irradiated onto a larger shot area of the photosensitive layer than the first electron beams, so that the second shot patterns are formed to larger than the first shot patterns.

In some embodiments, the first pattern is transcribed into a fine pattern having a small width in a semiconductor device and the second pattern is transcribed into a bulk pattern having a large width in the semiconductor device.

In some embodiments, the first and the second electron beams are sequentially irradiated on a whole area of the first and the second regions of the blank reticle, respectively, thereby completing a beam scan of the first and the second electron beams onto the first and the second regions, respectively.

In some embodiments, the beam scan of the first and the second electron beams is repeated without changes of exposure conditions.

In some embodiments, after completing the beam scan of the second electron beams on the second region of the blank reticle, third electron beams may be further irradiated onto marginal portions of the second shot patterns, thereby forming third shot patterns covering marginal portions of the neighboring second shot patterns.

In some embodiments, the third electron beams have cross-sectional area substantially identical to that of the second electron beams, so that the second and the third electron beams includes same bean intensities and intensity uniformity.

In some embodiments, an intensity uniformity of the second electron beams is inferior to that of the first electron beams.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. Example embodiments will be more clearly understood from the following detailed description taken in conjunction with the accompanying drawings in which:

FIG. 5 is a flow chart showing operations in methods of forming a reticle on which a mother pattern is transcribed using the electron beam exposure system shown in FIG. 1 according to some embodiments of the present inventive concept;

DETAILED DESCRIPTION

Figure 1:
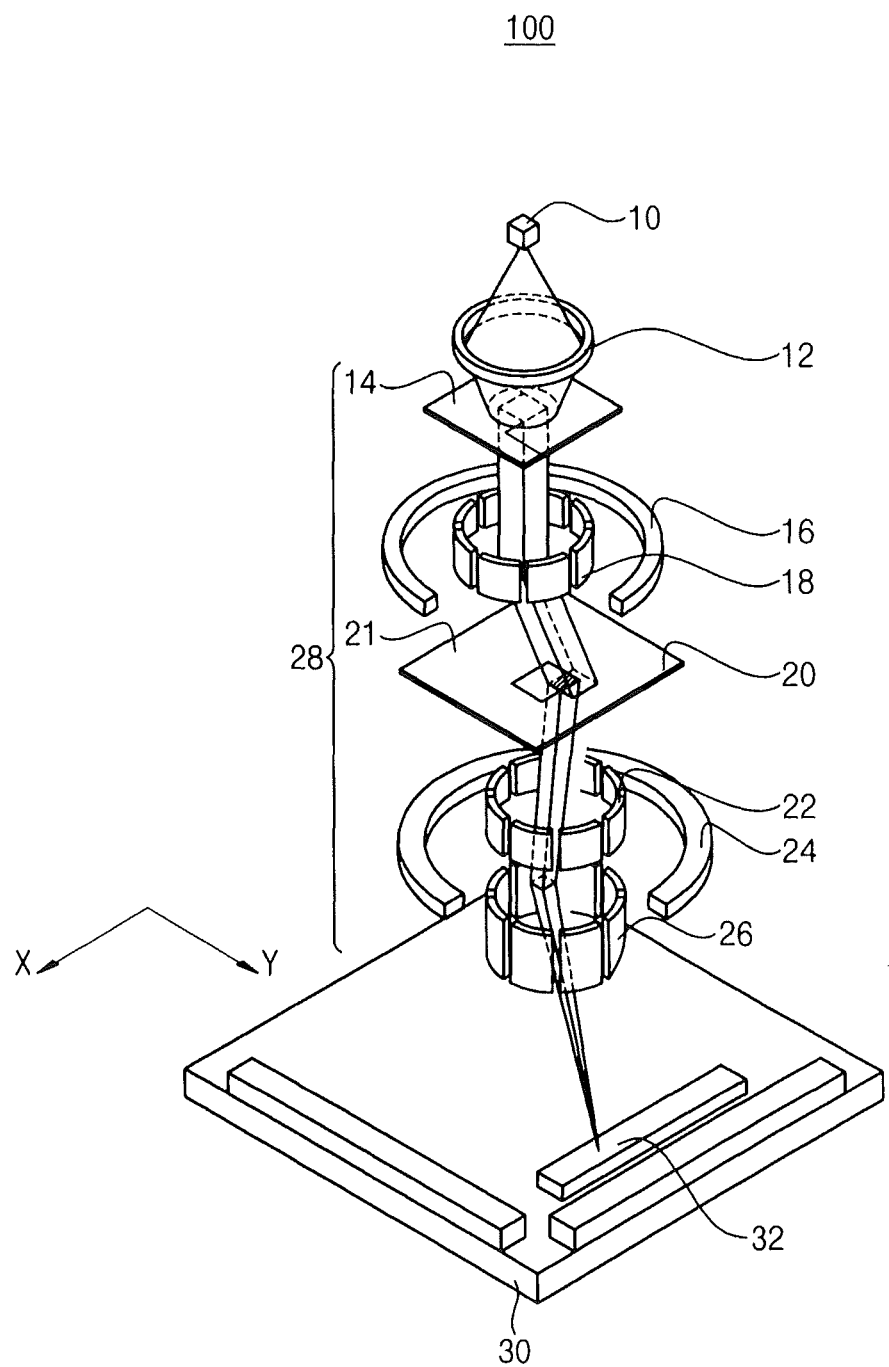
FIG. 1 is a perspective view illustrating an electron beam exposure system in accordance with some embodiments of the present inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Hereinafter, example embodiments will be explained in detail with reference to the accompanying drawings.

Electron Beam Exposure System

Figure 2A:
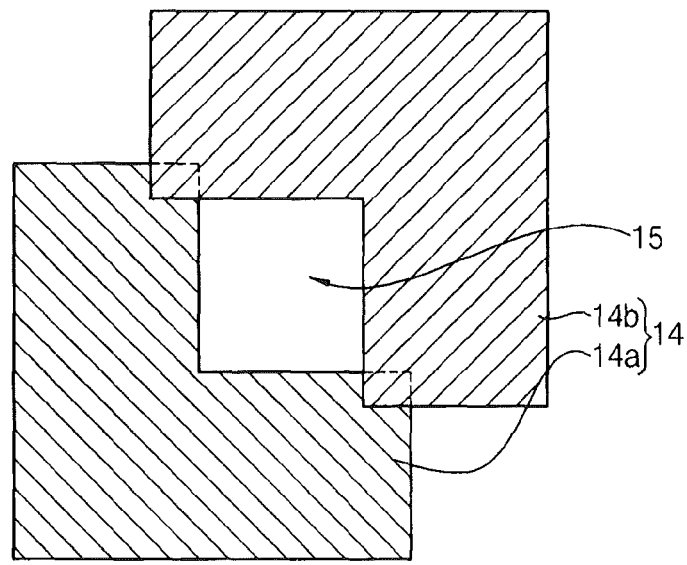
FIGS. 2A and 2B are plan views illustrating a first aperture of the electron beam exposure system shown in FIG. 1.
Figure 2B:
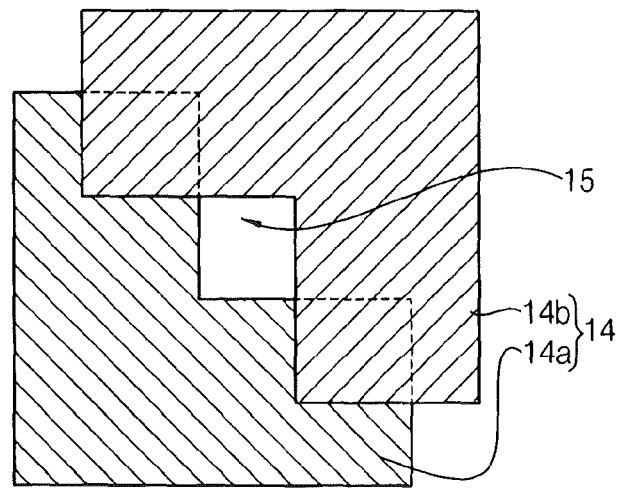

FIG. 1 is a perspective view illustrating an electron beam exposure system in accordance with some example embodiments of the present inventive concept. FIGS. 2A and 2B are plan views illustrating a first aperture of the electron beam exposure system shown in FIG. 1.

Referring to FIG. 1, an electron beam exposure system 100 in accordance with some embodiments of the present inventive concept may include an electron gun 10 from which an electron beam may be irradiated, a beam guider 28 for guiding the electron beam onto a blank reticle 32 such as a quartz substrate and a stage 30 on which the blank reticle 32 may be mounted.

The electron gun 10 may irradiate the electron beam having a preset cross-sectional area in such a way that the electron beam may be repeatedly irradiated at a constant period. For example, the electron gun 10 may repeat a scanning area and a stabilization area of the blank reticle 32.

The beam guider 28 may include a plurality of lenses 12, 16 and 24, a pair of apertures 14 and 20 and a plurality of reflectors 18, 22 and 26 and may control a path of the electron beam to focus onto the blank reticle 32. In some embodiments, the beam guider 28 may include a condenser lens 12, a first aperture 14, a projector lens 16, a shaping reflector 18, a second aperture 20, a supplementary reflector 22, an object lens 24 and a principal lens 26.

The electron beam irradiated from the electron gun 10 may be firstly condensed by the condenser lens 12.

Then, the firstly condensed electron beam may be partially transmitted through the first aperture 14 and thus the cross-sectional shape of the electron beam may be varied by the first aperture 14. In some embodiments, the first aperture 14 may control the size of the cross-sectional area of the electron beam. For example, the first aperture 14 may include a first opening through which the electron beam may penetrate and the shape and size of the first opening may be varied in accordance with process conditions.

As illustrated in FIGS. 2A and 2B, the first aperture 14 may include a first section 14a having an 'L' shape and a second section 14b having a '⌐' shape facing the L-shaped first section 14a. The first and the second sections 14a and 14b may be overlapped at edge portions to thereby form the first opening 15 at a central portion of the first aperture 14. Thus, the size of the first opening 15 may be varied according to the overlapping area of the first and the second sections 14a and 14b of the first aperture 14.

As illustrated in FIG. 2A, when the first and the second sections 14a and 14b may be overlapped at relatively small areas, the size of the first opening 15 may be relatively large. In contrast, when the first and the second sections 14a and 14b may be overlapped at relatively large areas, the size of the first opening 15 may be relatively small as illustrated in FIG. 2B.

The electron beam may transmit the first aperture 14 just through the first opening 15, and thus the size of the first opening 15 may determine the amount and size of the electron beam transmitting the first aperture 14.

The electron beam passing through the first aperture 14 may transmit the project lens 16 and may be reflected by the shaping reflector 18. Thus, the shaping reflector 18 may control the path of the electron beam.

The electron beam passing through the first aperture 14 may partially again transmit the second aperture 20, and thus the size and shape of the cross-sectional area of the electron beam may be again varied by the second aperture 20. For example, the second aperture 20 may include a second opening 21 through which the electron beam may penetrate and the shape and size of the second opening 21 may be varied in accordance with process conditions. Accordingly, the electron beam irradiated from the electron gun 10 may reach the blank reticle 32 through the first and the second openings 15 and 21 of the first and the second apertures 14 and 20.

The supplementary reflector 22 and the principal reflector 26 may control the path of the electron beam passing through the second aperture 20. The object lens 24 may deflect the electron beam to thereby focus onto the blank reticle 32.

Thus, the electron beam irradiated from the electron gun 10 may be focused onto the blank reticle 32 through the apertures and reflectors by the electron beam exposure system 100 and thus mother patterns corresponding to some integrated circuit patterns may be engraved onto the blank reticle 32.

Particularly when engraving the mother pattern onto the blank reticle 32, the electron beam exposure system 100 may facilitate the size variation of the first opening 15 and thus the shape and size of the cross-sectional area of the electron beam passing through the first aperture 14 may be easily modified according to the first opening 15.

As illustrated in FIG. 2A, when the first aperture 14 may be controlled in such a way that the first opening 15 may be relatively large, a relatively large number of electron beams may pass through the first aperture 14 and thus the size of a unit shot of the exposure system 100 may become relatively large. In contrast, when the first aperture 14 may be controlled in such a way that the first opening 15 may be relatively small, a relatively small number of electron beams may pass through the first aperture 14 and thus the size of a unit shot of the exposure system 100 may become relatively small. Since the size of the unit shot may determine the size of the blank reticle 32 exposed to the electron beam by a unit irradiation, the increase of the size of the unit shot may reduce the number of the exposure in the electron beam exposure system 100.

According to the electron beam exposure system 100, the size of the openings 15 and 21 may be easily varied in accordance with characteristics of circuit patterns such as a size and a priority of the circuit patterns, and thus the number of electron beams passing through the apertures 14 and 20 may be easily modified to thereby control the size of the unit shot, thereby reducing the process time for engraving the mother pattern onto the blank reticle 32.

Hereinafter, various modifications of the first aperture in the electron beam exposure system 100 in FIG. 1 will be described in detail with reference to FIGS. 3A to 4B.

Figure 3A:
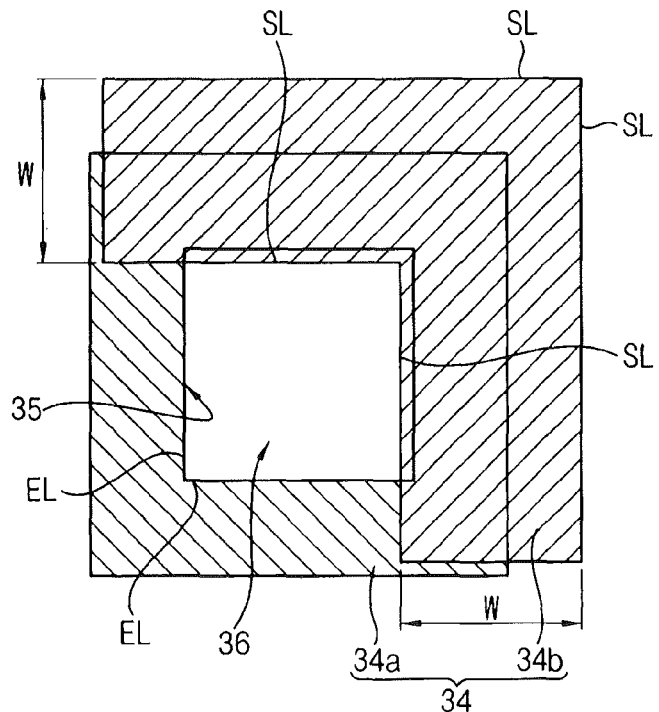
FIGS. 3A and 3B are plan views illustrating a first modification of the first aperture of the electron beam exposure system shown in FIG. 1.
Figure 3B:
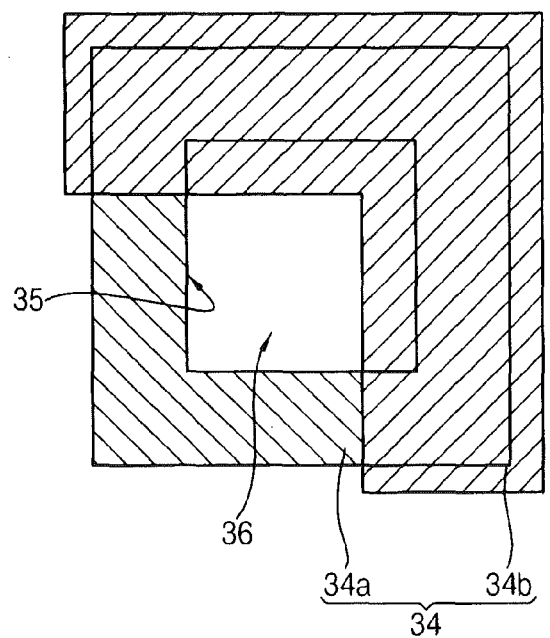

FIGS. 3A and 3B are plan views illustrating a first modification of the first aperture of the electron beam exposure system shown in FIG. 1.

Referring to FIGS. 3A and 3B, a first modification 34 of the first aperture 14 may include a first section 34a having a preliminary opening 35 at a central portion thereof and a second section 34b having an inverted 'L'-shaped section, which may also be defined as a '⌐' shape and overlapping with the first section 34a in such a way that some marginal portions of the preliminary opening 35 may be covered with edge portions of the second section 34b. Thus, the size and shape of the preliminary opening 35 may be varied by the overlap of the second section 34b with respect to the first section 34a.

The preliminary opening 35 of the first section 34a may have the size sufficiently for an allowable maximal cross-sectional area of the electron beam in the electron beam exposure system 100. Further, the side lines of the ⌐-shaped second section 34b may have a length longer than an edge line EL of the preliminary opening 35, and thus the preliminary opening 35 may be partially covered with the second section 34b that may be overlapped with the first section 34a. A width W of the second section 34b may be equal to or greater than the edge line EL of the preliminary opening 35.

Residuals of the preliminary opening 35, which may not be covered with the second section 34b, may be formed into a first transmitting hole 36 of the first modification 34 of the first aperture 14. The first transmitting hole 36 may correspond to the first opening of the first aperture 14 of the electron beam exposure system 100 and the electron beam may pass through the first modification 34 of the first aperture 14 just merely through the first transmitting hole 46. The size of the first transmitting hole 36 may be varied according to the coverage area that may be covered with the second section 34b, and thus the amount of the electron beams or the size of the unit shot may be easily controlled by variation of the size of the first transmitting hole 36.

Figure 4A:
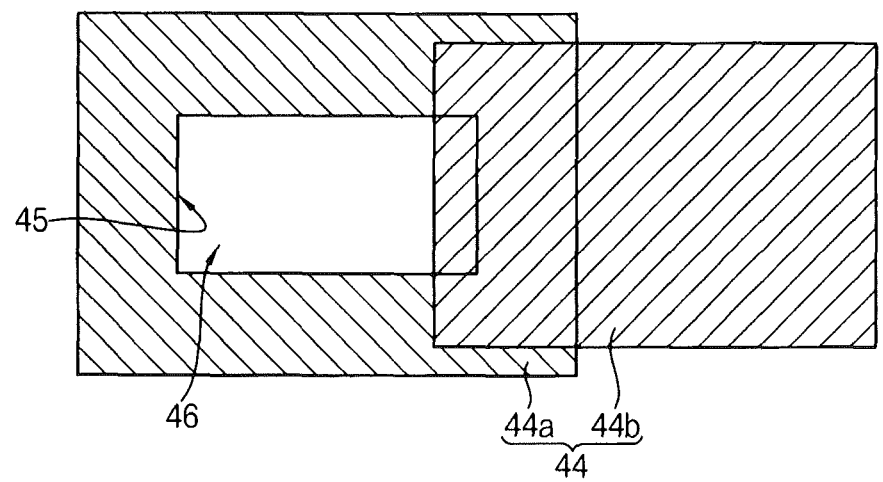
FIGS. 4A and 4B are plan views illustrating a second modification of the first aperture of the electron beam exposure system shown in FIG. 1.
Figure 4B:
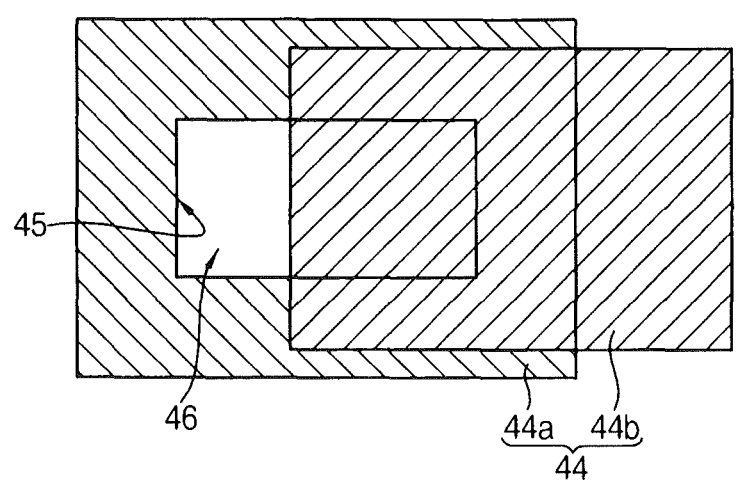

FIGS. 4A and 4B are plan views illustrating a second modification of the first aperture of the electron beam exposure system shown in FIG. 1.

Referring to FIGS. 4A and 4B, a second modification 44 of the first aperture 14 may include a first section 44a having a preliminary opening 45 at a central portion thereof and a rectangular plate-shaped second section 44b overlapping with the first section 44a in such a way that some portions of the preliminary opening 45 may be covered with the second section 44b. Thus, the size and shape of the preliminary opening 45 may be varied by the overlap of the second section 44b with respect to the first section 44a.

Residuals of the preliminary opening 45, which may not be covered with the second section 44b, may be formed into a second transmitting hole 46 of the second modification 44 of the first aperture 14. The second transmitting hole 46 may correspond to the first opening of the first aperture 14 of the electron beam exposure system 100 and thus the electron beam may pass through the second modification 44 of the first aperture 14 that may be defined by the second transmitting hole 46. The size of the second transmitting hole 46 may be varied according to the coverage area that may be covered with the second section 44b, and thus the amount of the electron beams and/or the size of the unit shot may be easily controlled by variation of the size of the second transmitting hole 46.

Methods of Forming a Reticle

Figure 6:
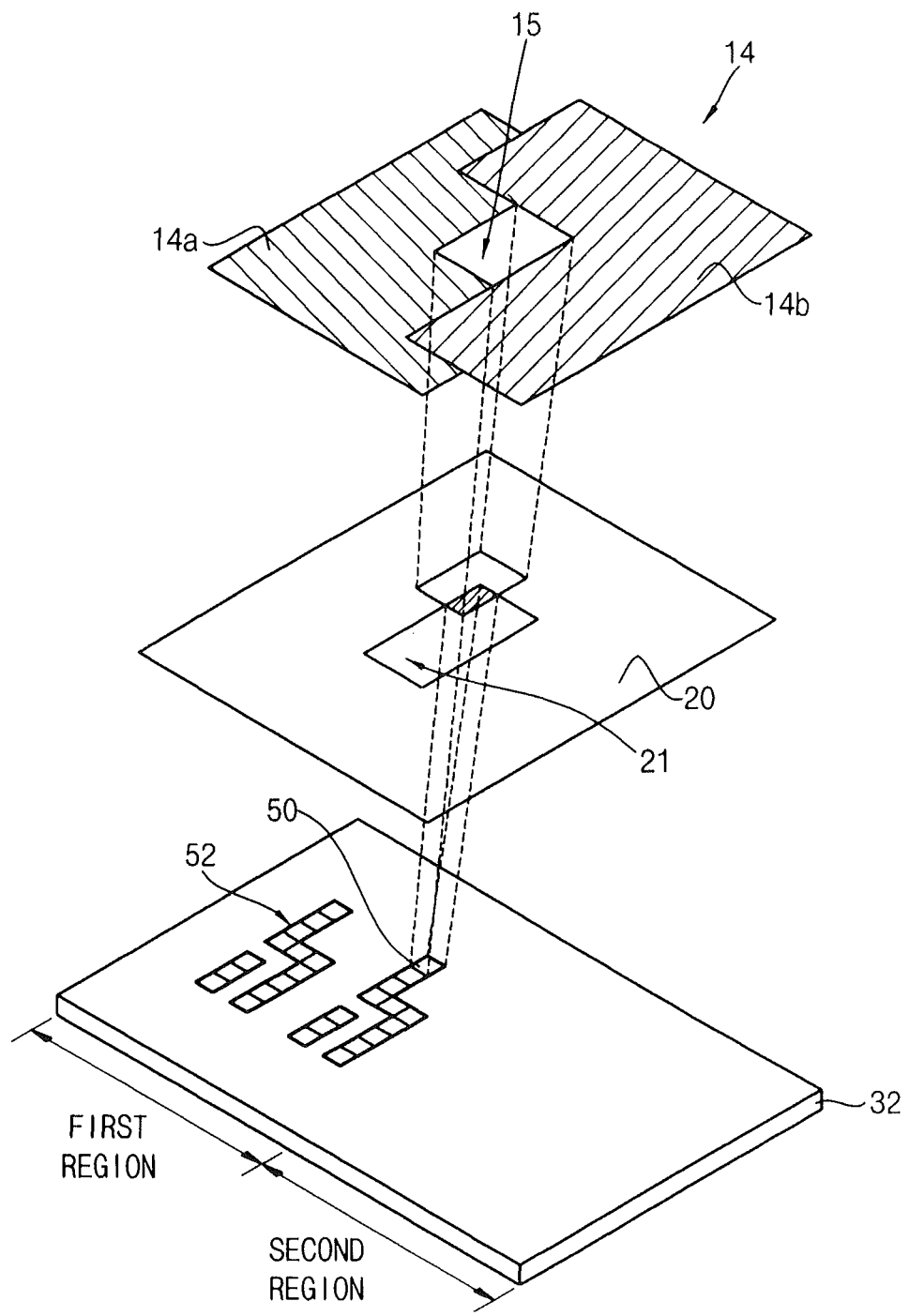
FIG. 6 is a perspective view illustrating methods of transcribing a fine circuit pattern having a priority onto the blank reticle using the electron beam exposure system shown in FIG. 1.

FIG. 5 is a flow chart showing operations corresponding to methods of forming a reticle on which a mother pattern is transcribed using the electron beam exposure system shown in FIG. 1. FIG. 6 is a perspective view illustrating methods of transcribing a fine circuit pattern having a priority onto the blank reticle using the electron beam exposure system shown in FIG. 1.

Referring to FIGS. 5 and 6, a light shielding layer (not shown) including chromium (Cr) may be formed on a transparent reticle such as a quartz substrate and a photosensitive layer may be formed on the light shielding layer, to thereby form a blank reticle 32 on which the light shielding layer and the photosensitive layer are sequentially stacked.

The blank reticle 32 may be divided into a first region 52 in which the circuit patterns having a priority may be transcribed and a second region in which the circuit pattern having no priority may be transcribed. The circuit patterns having a priority may include an operation pattern directly related to an operation of a semiconductor device and a fine pattern having a minute width, and the circuit patterns having no priority may include a sacrificial pattern and a dummy pattern having no effect on the operation of a semiconductor device. In addition, the circuit patterns having no priority may include a bulk pattern having a width relatively larger than that of the circuit patterns having a priority.

The blank reticle 32 may be loaded onto a stage 30 of the electron beam exposure system 100 (block 510).

Exposure recipes may be set up in the electron beam exposure system 100 with respect to the photosensitive layer of the first region 52 of the blank reticle 32. Since the circuit pattern in the first region 52 may have a minute width, the photosensitive layer of the first region 52 may be difficult to be accurately patterned and thus the electron beam irradiating to the first region 52 of the blank reticle 32 may have high uniformity.

For example, the size of the first opening 15 of the first aperture 14 may be reduced by enlarging the overlapping area of the first and the second sections 14a and 14b, and thus the size of the cross-sectional area of the electron beams passing through the first opening 15 may be reduced (block 512).

Figure 7:
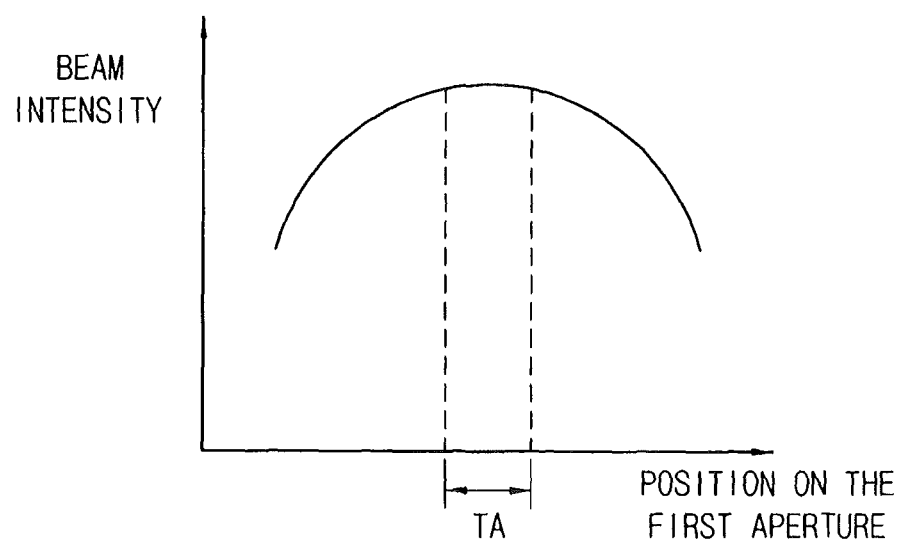
FIG. 7 is a graph showing a distribution of beam intensity irradiated from the electron gun 10 with respect to the first aperture having a small opening in the electron beam exposure system 100.

FIG. 7 is a graph showing a distribution of beam intensity irradiated from the electron gun 10 with respect to the first aperture having a small opening in the electron beam exposure system 100. In FIG. 7, the horizontal line indicates positions of the first aperture 14 and the vertical line indicates the beam intensity of the electron beam irradiated from the electron gun 10.

Referring to FIG. 7, the beam intensity of the electron beam, which may be irradiated from the electron gun 10, may have a concave distribution on a whole area of the first aperture 14. Thus, the electron beam may have the highest beam intensity at a central highest point and the lowest beam intensity at marginal points substantially symmetrical with respect to the central highest point. That is, the beam intensity of the electron beam may be varied along a concave curve on a whole area of the first aperture 14. When the electron beam may pass through a small transmitting area TA, the variation of the concave curve corresponding to the transmitting area TA may be very small and thus the electron beams passing through the small transmitting area TA may be uniform in view of the beam density.

Accordingly, since the electron beam may penetrate the first aperture 14 merely through the first opening 15, the size reduction of the first opening 15 may allow the electron beams to pass through the first opening 15 with high uniformity of the beam density. That is, the smaller the size of the first opening 15 of the first aperture 14 is, the more uniform the beam intensity of the electron beam passing through the first opening 15 may be.

In some embodiments, the first and the second sections 14a and 14b may be overlapped with each other in such a way that the first opening 15 may be reduced to a relatively small size, and thus the electron beams passing through the first opening 15 may have substantially similar beam densities. That is, the uniformity of the beam intensity of the electron beams may be improved by reducing the size of the first opening 15 of the first aperture 14. Particularly, the first opening 15 may be located around the highest point of the concave curve and thus the first electron beams may have the highest beam density as well as the high uniformity of the beam density.

Thereafter, as illustrated in FIG. 6, the second aperture 20 may be controlled such that the electron beams passed through the first aperture 14 and that have high beam density may pass through the second opening 21. Therefore, the electron beams irradiated from the electron gun 10 may be formed into a first electron beam of which the size and shape of the cross-sectional area may be varied in accordance with the first region 52 of the blank reticle 32.

Then, the first electron beam may be focused onto the blank reticle 32. In such a case, the size of the cross-sectional area of the first electron beam may determine the size of the first shot pattern 50 that may be a unit pattern corresponding to a unit irradiation of the electron beams.

Thus, the first electron beam may be irradiated onto the photosensitive layer of the blank reticle 32 in the first region and the first shot patterns 50 may be formed on the blank reticle 32 in the first region (block 514).

Particularly, the photosensitive layer of the blank reticle 32 may be divided into a plurality of first shot areas in the first region and the first electron beam may be irradiated onto each of the first shot areas, to thereby form the first shot patterns 50.

Figure 8:
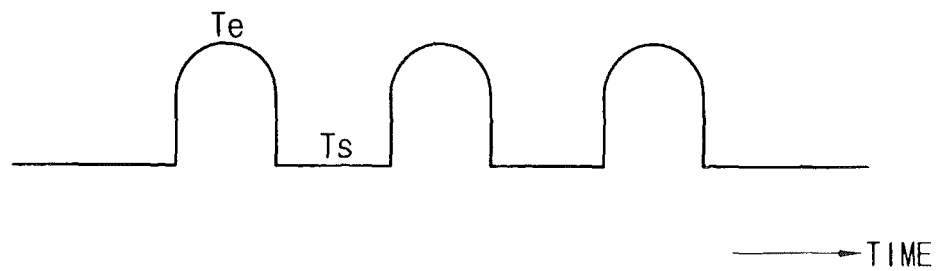
FIG. 8 is a view illustrating an irradiation mode of the electron beams in the electron gun of the electron beam exposure system shown in FIG. 1.

FIG. 8 is a view illustrating an irradiation mode of the electron beams in the electron gun of the electron beam exposure system shown in FIG. 1.

As illustrated in FIG. 8, the electron beams may be irradiated periodically between an emission time Te and a stopping time Ts. The electron beams may be irradiated from the electron gun 10 for the emission time and the irradiation of the electron beams may be stopped for the stopping time Ts for stabilizing the irradiated electron beam. Thus, the photosensitive layer of the blank reticle 32 may be exposed to the electron beam just for the emission time Ts.

Therefore, the unit irradiation of the electron beam onto the blank reticle 32 may be performed at every emission time Te and the first shot area 50 of the blank reticle 32 may be exposed to the electron beam at every emission time Te. Thus, the first electron beam may be irradiated for a first emission time Te1 and one of the first shot areas may be exposed to the first electron beam for the first emission time Te1, to thereby form the first shot pattern 50 at a first location in the first region of the blank reticle 32. After an elapse of a first stopping time Ts1, the first electron beam may be again irradiated for a second emission time Te2 and the next first shot areas may be exposed to the first electron beam for the second emission time Te2, to thereby form the first shot pattern 50 at a second location adjacent to the first location in the first region of the blank reticle 32. The irradiation of the electron beam and the exposure of the first shot area to the electron beam for the emission time Te may be individually performed at every first shot area, and thus the first shot patterns 50 may be formed individually for each emission time Te in the first region of the blank reticle 32. Particularly, the first shot areas may be arranged in a line in the first region of the blank reticle 32, the first shot patterns 50 may be sequentially formed on the first region of the blank reticle 32 along the emission time Te order.

When the number of electrons may be excessively large in the unit irradiation of the electron beam, the diffusion of the electron beam may tend to cause damage to the photosensitive layer of the blank reticle 32 and the electron beam may be insufficient for patterning the photosensitive layer of the blank reticle 32. That is, the photosensitive layer in the first region of the blank reticle 32 may be insufficiently patterned by the first electron beams.

Therefore, when the photosensitive layer may not be sufficiently patterned into the first shot pattern 50 just by a first scan of the electron beams on all of the first shot areas, a second scan of the electron beams may be performed on all of the first shot areas in the same process as described above. That is, the photosensitive layer of the first shot areas may be sufficiently exposed to the electron beams by repeating the scan of the electron beams on all of the first shot areas. The repetition quantity of the scans of the electron beams may be individually determined at each of the first shot areas of the blank reticle 32, and thus three or more scans may be performed at a particular first shot area of the blank reticle 32.

Accordingly, the photosensitive layer in the first region 52 of the blank reticle 32 may be sufficiently formed into the first shot patterns 50 by the electron beams.

Then, the photosensitive layer in the second region of the blank reticle 32 may be formed into a pattern by an exposure process in the electron beam exposure system 100. Hereinafter, the electron beam irradiated onto the second region of the blank reticle 32 is referred to as a second electron beam so as to differentiate from the first electron beam that may be irradiated onto the first region of the blank reticle 32.

Figure 9:
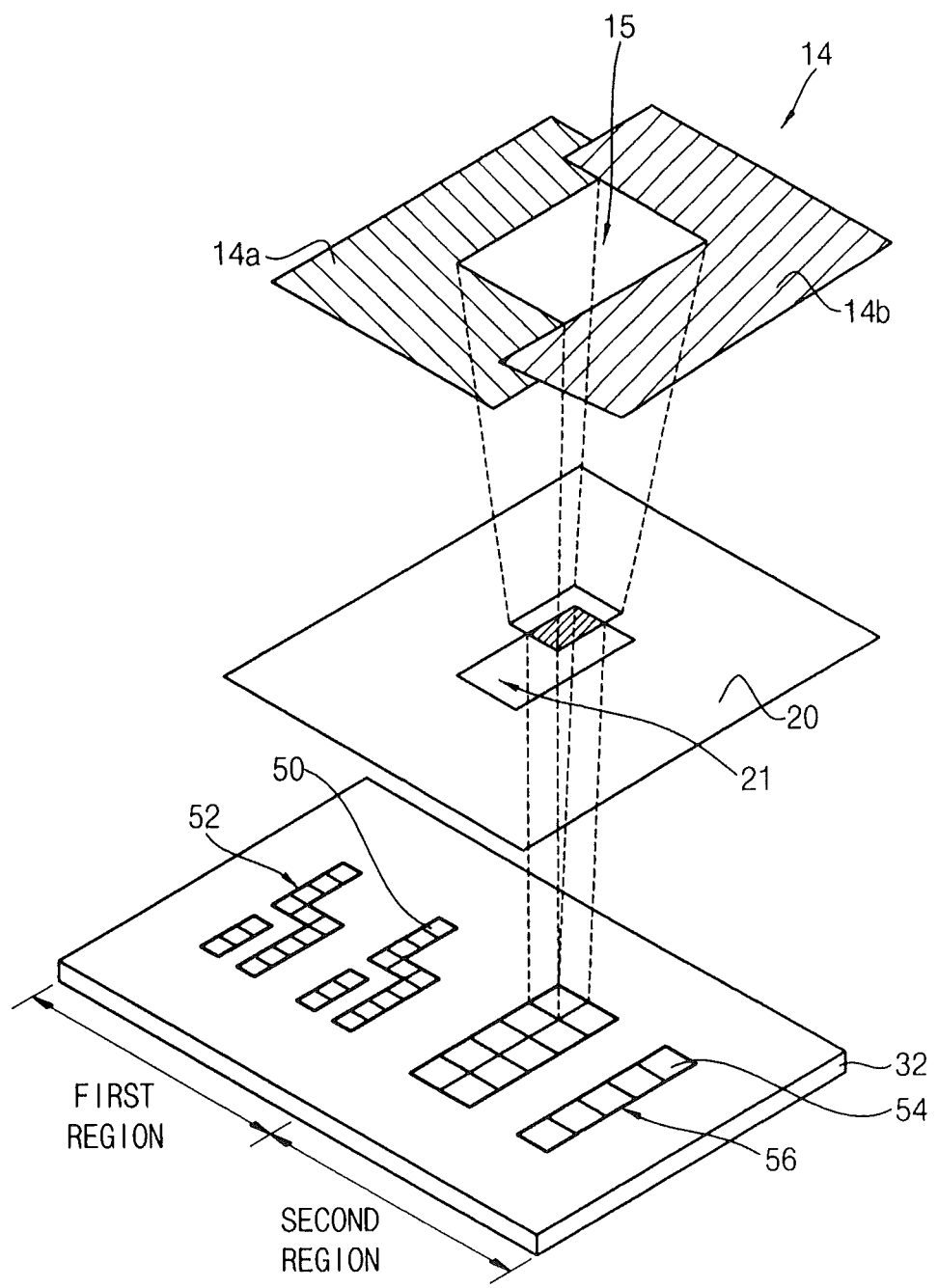
FIG. 9 is a perspective view illustrating methods of transcribing a bulk circuit pattern having no priority onto the blank reticle using the electron beam exposure system shown in FIG. 1.

FIG. 9 is a perspective view illustrating methods of transcribing a bulk circuit pattern having no priority onto the blank reticle using the electron beam exposure system shown in FIG. 1.

Referring to FIGS. 5 and 9, the exposure recipes may be changed in the electron beam exposure system 100 with respect to the photosensitive layer of the second region 56 of the blank reticle 32.

The bulk circuit pattern having no priority may have a width that is larger than that of the fine circuit pattern having a priority and may have no effect on the operation of semiconductor devices. For at least these reasons, the photosensitive layer of the second region 56 may be relatively accurately patterned without exposure defects even though the electron beam may not have the same beam density as the electron beam that may be irradiated onto the first region 52 of the blank reticle 32. In addition, although exposure defects may be generated in transcribing the bulk pattern onto the second region 56 of the blank reticle 32 due to the low density of the electron beam, the defects of the bulk pattern may not cause any operation failures of semiconductor devices since the bulk circuit pattern may have no effect on the operation of the semiconductor devices. For at least these reasons, the photosensitive layer of the second region 56 may be patterned by the electron beam having a relatively low beam density.

For example, the size of the first opening 15 of the first aperture 14 may be increased by reducing the overlapping area of the first and the second sections 14a and 14b (block 516), and thus the size of the cross-sectional area of the electron beams passing through the first opening 15 may be increased.

Figure 10:
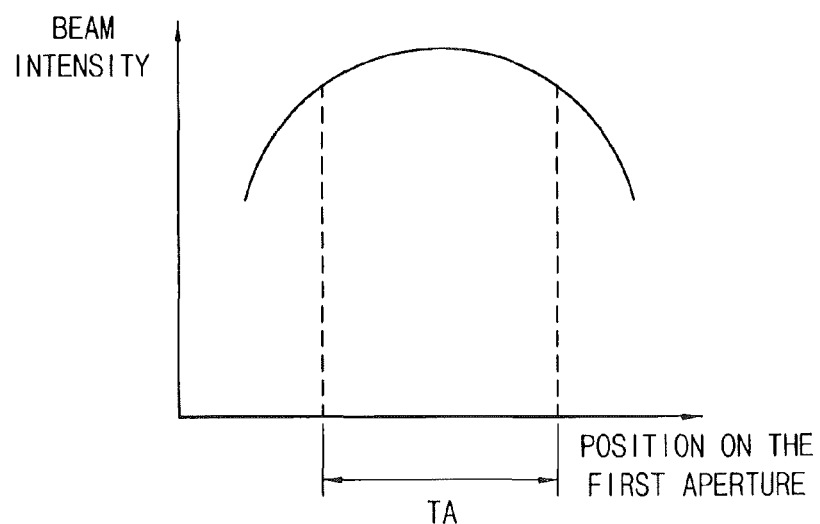
FIG. 10 is a graph showing a distribution of beam intensity irradiated from the electron gun 10 with respect to the first aperture having a large opening in the electron beam exposure system 100.

FIG. 10 is a graph showing a distribution of beam intensity irradiated from the electron gun 10 with respect to the first aperture having a large opening in the electron beam exposure system 100. In FIG. 10, the horizontal line indicates positions of the first aperture 14 and the vertical line indicates the beam intensity of the electron beam irradiated from the electron gun 10, similar to the graph illustrated in FIG. 7.

Referring to FIG. 10, the beam intensity of the electron beam, which may be irradiated from the electron gun 10, may have a concave distribution on a whole area of the first aperture 14. The beam intensity of the electron beam may be varied along a concave curve on a whole area of the first aperture 14 in the same way as described with reference to FIG. 7.

When the electron beam may pass through a large transmitting area TA, the variation of the concave curve corresponding to the transmitting area TA may be relatively large and wide and thus the electron beams passing through the large transmitting area TA may be non-uniform in view of the beam density. Accordingly, the size enlargement of the first opening 15 may deteriorate the uniformity of the beam intensity of the electron beams passing through the first opening 15.

In some embodiments, the first and the second sections 14a and 14b may be overlapped with each other in such a way that the first opening 15 may be enlarged to a relatively large size, and thus the electron beams passing through the first opening 15 may have various beam densities. That is, the uniformity of the beam intensity of the second electron beams may be deteriorated by enlarging the size of the first opening 15 of the first aperture 14. Therefore, the second electron beams passing through the first opening 15 in the second region 56 may have more various beam densities than the first electron beams passing through the first opening 15 in the first region 52. In addition, the average beam density of the second electron beams may be lower than that of the first electron beams.

Thereafter, the second aperture 20 may be controlled such that the electron beams passed through the first aperture 14 and having various beam densities may pass through the second opening 21. Therefore, the electron beams irradiated from the electron gun 10 may also be formed into the second electron beam of which the size and shape of the cross-sectional area may be varied in accordance with the second region of the blank reticle 32.

Then, the second electron beam may be focused onto the blank reticle 32. In such a case, the size of the cross-sectional area of the second electron beam may determine the size of the second shot pattern 54 that may be a unit pattern corresponding to a unit irradiation of electron beams. The second shot pattern 54 may be larger than the first shot pattern 50. As described above, the size of the second shot pattern 54 may be varied by the size of the first opening 15 of the first aperture 14.

Thus, the second electron beam may be irradiated onto the photosensitive layer of the blank reticle 32 in the second region 56 and the second shot patterns 54 may be formed on the blank reticle 32 in the second region 56 (block 518).

Particularly, the photosensitive layer of the blank reticle 32 may be divided into a plurality of second shot areas in the second region and the second electron beams may be irradiated onto each of the second shot areas, to thereby form the second shot patterns 54.

Figure 11:
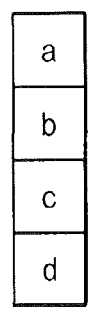
FIG. 11 is a view illustrating a plurality of the second shot areas of the photosensitive layer that are arranged in a line on the blank reticle.
Figure 12:
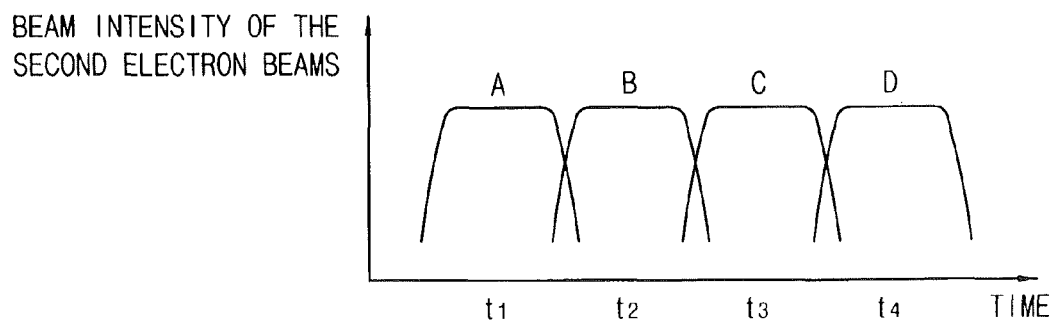
FIG. 12 is a view illustrating an irradiation mode of the second electron beams in the electron gun of the electron beam exposure system shown in FIG. 1.

FIG. 11 is a view illustrating a plurality of the second shot areas of the photosensitive layer that are arranged in a line on the blank reticle. FIG. 12 is a view illustrating an irradiation mode of the second electron beams in the electron gun of the electron beam exposure system shown in FIG. 1.

Referring to FIGS. 11 and 12, the electron gun 10 may irradiate the electron beams discontinuously by repeating emission and stopping of the electron beams. The electron beams may be irradiated from the electron gun 10 for an emission time and the irradiation of the electron beams may be stopped for a stopping time for stabilizing the irradiated electron beam. Thus, the photosensitive layer of the blank reticle 32 may be exposed to the electron beam just for the emission time.

Therefore, the unit irradiation of the electron beam onto the blank reticle 32 may be performed at every emission time and the second shot areas a, b, c and d of the blank reticle 32 may be exposed to the electron beam A, B, C and D at every emission time, respectively. Thus, the second electron beam A may be irradiated for a first emission time t1 and the second shot area a may be exposed to the second electron beam A for the first emission time t1, to thereby form the second shot pattern 54 at the second shot area a of the second region of the blank reticle 32. After an elapse of a first stopping time, the second electron beam B may be again irradiated for a second emission time t2 and the next second shot area b may be exposed to the second electron beam B for the second emission time t2, to thereby form the second shot pattern 54 at the second shot area b in the second region of the blank reticle 32. In the same way, the second electron beams C and D may be again irradiated for a third and fourth emission times t3 and t4 and the next second shot areas c and d may be exposed to the second electron beams C and D for the third and fourth emission times t3 and t4, to thereby form the second shot pattern 54 at the second shot areas c and d in the second region of the blank reticle 32. The above-described processes may be repeated until all of the second shot areas may be sufficiently exposed to the respective second electron beams, respectively, to thereby form the second shot patterns 54 in the second region of the blank reticle 32.

When the photosensitive layer may not be sufficiently patterned into the second shot patterns 54 just by a first scan of the electron beams on all of the second shot areas, a second scan of the electron beams may be performed on all of the second shot areas in the same process as described above. That is, the photosensitive layer of the second shot areas may be sufficiently exposed to the electron beams by repeating the scan of the electron beams on all of the second shot areas (block 520). The repetition quantity of the scans of the electron beams may be individually determined at each of the second shot areas of the blank reticle 32. In some embodiments, three or more scans may be performed at a particular second shot area of the blank reticle 32.

Since the second electron beams may have cross-sectional areas larger than that of the first electron beams, the second shot patterns 54 may have larger size than that of the first shot patterns 50. Therefore, the number of beam scans may be decreased in the second region 56 compared with the first region 52, and thus the bulk pattern having no priority may be transcribed onto the blank reticle 32 in the second region for a shorter time than the fine pattern having a priority in the first region.

Since the bulk pattern may be formed on the second region of the blank reticle 32 by the second electron beams having low beam density uniformity for a relatively shorter time, the bulk pattern having no priority may tend to have more defects than the fine pattern having a priority on the reticle. However, since the bulk pattern may have no substantial effect on the operation of the semiconductor devices and a relatively large width, the second electron beams having low beam density uniformity may be sufficient for forming the reticle including the bulk pattern.

Thereafter, the photosensitive layer of the first shot patterns 50 and the second shot patterns 54 may be developed by a development process, to thereby form first and second mask patterns on the first and the second regions of the blank reticle 32, respectively (block 522). The first mask pattern may function as a mask pattern for forming the fine pattern on the blank reticle 32 and the second mask pattern may function as a mask pattern for forming the bulk pattern on the blank reticle 32.

The light shielding layer may be etched off using the first and the second mask patterns as an etching mask, and thus the fine pattern having a priority may be formed on the first region of the transparent reticle substrate and the bulk pattern having no priority may be formed on the second region of the transparent reticle substrate, respectively, thereby forming the reticle including the mother pattern of the fine pattern and the bulk pattern (block 524).

According to some embodiments of the present inventive concept, the beam density and the size of the cross-sectional area of the electron beams may be changed in accordance with the size and priority of the mother pattern and thus the exposure time to the photosensitive layer may be reduced. Therefore, the process time for the formation of the reticle including the mother pattern may be reduced to thereby increase the efficiency for forming the reticle.

Hereinafter, other methods of forming the reticle will be described in detail with reference to FIGS. 13 to 15.

Figure 13:
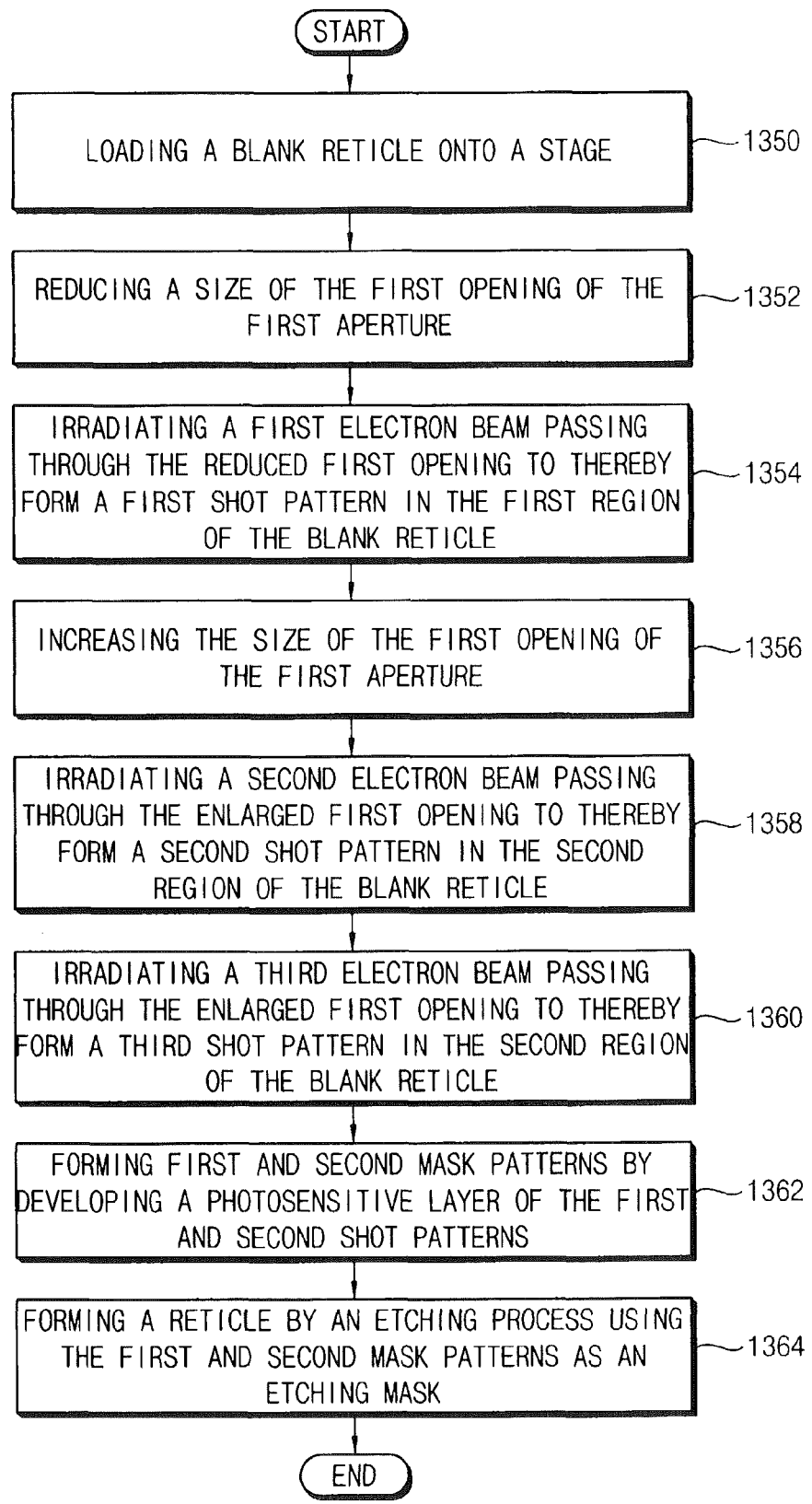
FIG. 13 is a flow chart showing operations in methods of forming a reticle on which a mother pattern is transcribed using the electron beam exposure system shown in FIG. 1 according to some embodiments of the present inventive concept.

FIG. 13 is a flow chart showing operations according to methods of forming a reticle on which a mother pattern is transcribed using the electron beam exposure system shown in FIG. 1. In FIG. 13, the reticle may be formed through the same processing steps as shown in FIG. 5, except the processing step for irradiating the second electron beams onto the photosensitive layer in the second region of the blank reticle.

Referring to FIG. 13, the blank reticle 32 on which the light shielding layer and the photosensitive layer are sequentially stacked may be divided into a first region in which the circuit patterns having a priority may be transcribed and a second region in which the circuit pattern having no priority may be transcribed.

The blank reticle 32 may be loaded onto a stage 30 of the electron beam exposure system 100 (block 1350).

Exposure recipes may be set up in the electron beam exposure system 100 with respect to the photosensitive layer of the first region 52 of the blank reticle 32.

In the same way as described with reference to FIG. 6, the size of the first opening 15 of the first aperture 14 may be reduced by enlarging the overlapping area of the first and the second sections 14a and 14b, and thus the size of the cross-sectional area of the electron beams passing through the first opening 15 may be reduced (block 1352).

Then, the first electron beams may be irradiated onto the photosensitive layer in the first region of the blank reticle 32 in the same way process as described with reference to FIG. 5 to FIG. 8.

Particularly, the photosensitive layer of the blank reticle 32 may be divided into a plurality of first shot areas in the first region and the first electron beam may be irradiated onto each of the first shot areas, to thereby form the first shot patterns 50. As described with reference to FIG. 8, the first electron beams may be individually irradiated onto the first shot areas, respectively, until all of the first shot areas in the first region may be exposed to the first electron beams. Thus, the first shot patterns 50 may be individually formed on the first region of the blank reticle 32.

When the photosensitive layer may not be sufficiently patterned into the first shot pattern 50 just by a first scan of the electron beams onto the first shot areas, a second scan of the electron beams may be further performed on the first shot areas in the same process as described above. That is, the photosensitive layer of the first shot areas may be sufficiently exposed to the electron beams by repeating the scan of the electron beams on the first shot areas. The repetition quantity of the scans of the electron beams may be individually determined at each first shot area, and thus three or more scans may be performed at a particular first shot area of the blank reticle 32. Accordingly, the photosensitive layer in the first region 52 of the blank reticle 32 may be sufficiently formed into the first shot patterns 50 by the first electron beams.

Then, the photosensitive layer in the second region of the blank reticle 32 may be formed into a pattern by an exposure process in the electron beam exposure system 100. Hereinafter, the electron beam irradiated onto the second region of the blank reticle 32 is referred to as a second electron beam so as to differentiate from the first electron beam that may be irradiated onto the first region of the blank reticle 32.

As illustrated in FIG. 9, the exposure recipes may be changed in the electron beam exposure system 100 with respect to the photosensitive layer of the second region 56 of the blank reticle 32.

For example, the size of the first opening 15 of the first aperture 14 may be increased by reducing the overlapping area of the first and the second sections 14a and 14b (block 1356), and thus the size of the cross-sectional area of the electron beams passing through the first opening 15 may be increased. The second electron beams passing through the first opening 15 in the second region 56 may have more various beam densities than the first electron beams passing through the first opening 15 in the first region 52. In addition, the average beam density of the second electron beams may be lower than that of the first electron beams.

Thereafter, the second aperture 20 may be controlled such that the electron beams passed through the first aperture 14 and that have various beam densities may pass through the second opening 21. Therefore, the electron beams irradiated from the electron gun 10 may also be formed into the second electron beam of which the size and shape of the cross-sectional area may be varied in accordance with the second region of the blank reticle 32.

Then, the second electron beam may be focused onto the blank reticle 32. In such a case, the size of the cross-sectional area of the second electron beam may determine the size of the second shot pattern 54 that may be a unit pattern corresponding to a unit irradiation of electron beams. The second shot pattern 54 may be larger than the first shot pattern 50. As described above, the size of the second shot pattern 54 may be varied by the size of the first opening 15 of the first aperture 14.

Thus, the second electron beam may be irradiated onto the photosensitive layer of the blank reticle 32 in the second region 56 and the second shot patterns 54 may be formed on the blank reticle 32 in the second region 56 (block 1358).

Particularly, the photosensitive layer of the blank reticle 32 may be divided into a plurality of second shot areas in the second region and the second electron beams may be irradiated onto each of the second shot areas, to thereby form the second shot patterns 54 in the second region 56 of the blank reticle 32.

The irradiation of the second electron beams and the exposure of the second shot area to the second electron beam may be individually performed at every second shot area, and thus the second shot patterns 54 may be formed individually in the second region of the blank reticle 32. The second electron beams may be individually irradiated onto the second shot areas, respectively, until all of the second shot areas in the second region may be exposed to the second electron beams. Thus, the second shot patterns 54 may be individually formed on the second region of the blank reticle 32.

Since the second electron beams may have various beam intensities and low average beam intensity, the marginal areas of the neighboring second shot areas may not be sufficiently exposed to the second electron beams. As such, edge portions of the second shot patterns 54 may be insufficiently patterned.

The boundary areas may be further exposed to the electron beams for a sufficient exposure of the boundary areas of the neighboring second shot areas in the second region 56 of the blank reticle 32. Hereinafter, the electron beam irradiated onto the boundary areas is referred to as third electron beams so as to differentiate from the second electron beams that may be irradiated onto the second shot areas and the marginal areas of the neighboring second shot areas are referred to as third shot areas so as to differentiate from the second shot areas. Thus, the third electron beams may be further irradiated onto the third shot areas in the second region of the blank reticle 32 (block 1360).

Therefore, the second and the third electron beams may pass through the same first opening 15 of the first aperture 14, and the sizes and shapes of the cross-sectional areas of the second and third electron beams may be substantially the same. Thus, the third shot pattern may be formed at a position on the second region of the blank reticle 32 corresponding to the boundary areas and may have substantially the same size as the second shot pattern 54.

Figure 14:
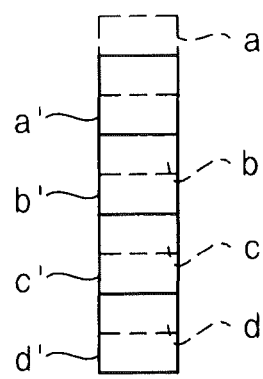
FIG. 14 is a view illustrating a plurality of the second and the third shot areas of the photosensitive layer that are arranged in a line on the blank reticle.

FIG. 14 is a view illustrating a plurality of the second and the third shot areas of the photosensitive layer that are arranged in a line on the blank reticle. FIG. 15 is a view illustrating an irradiation mode of the second and the third electron beams in the electron gun of the electron beam exposure system shown in FIG. 1.

Figure 15:
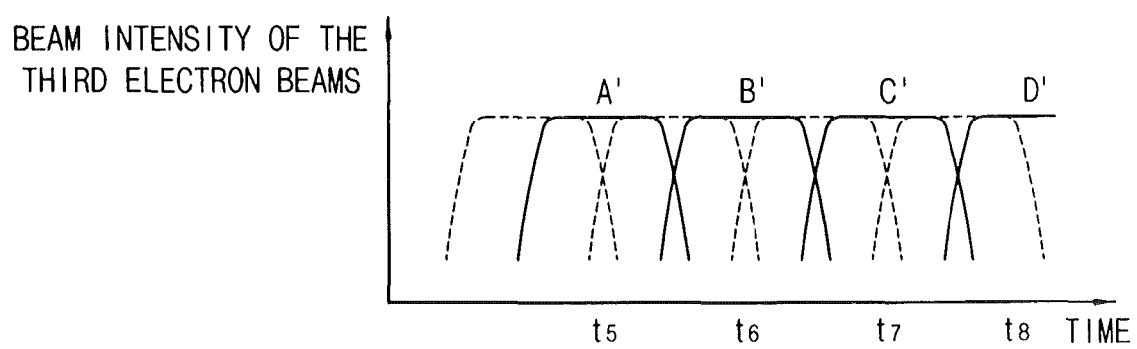
FIG. 15 is a view illustrating an irradiation mode of the second and the third electron beams in the electron gun of the electron beam exposure system shown in FIG. 1.

Referring to FIGS. 14 and 15, the second electron beams may be individually irradiated onto the second shot areas a, b, c and d, respectively, until all of the second shot areas in the second region may be exposed to the second electron beams. Thus, the second shot patterns 54 may be individually formed on the second region 56 of the blank reticle 32.

Thereafter, the third electron beams may be individually irradiated onto the third shot areas a', b', c' and d', respectively, until all of the third shot areas in the second region may be exposed to the third electron beams. Thus, the third shot patterns may be individually formed on the second region 56 of the blank reticle 32. Thus, the second region 56 of the blank reticle 32 may be scanned twice by the second and the third electron beams.

The exposure recipes of the electron beam exposure system 100 may divide the photosensitive layer in the second region 56 in such a way that the third shot areas a' to d' may be defined on the photosensitive layer at the marginal areas of the neighboring second shot areas and may have the same size as the second shot areas. Therefore, marginal portions of the neighboring second shot areas may be defined into the third shot area.

Particularly, the electron gun 10 may irradiate the third electron beams discontinuously by repeating emission and stopping of the third electron beams. The third electron beams may be irradiated from the electron gun 10 for an emission time and the irradiation of the third electron beams may be stopped for a stopping time for stabilizing the irradiated third electron beams. Thus, the photosensitive layer of the blank reticle 32 may be exposed to the third electron beams just for the emission time.

The third shot areas a', b', c' and d' of the blank reticle 32 may be exposed to the third electron beams A', B', C' and D' at every emission time, respectively. Thus, the third electron beam A' may be irradiated for a first emission time t5 and the third shot area a' may be exposed to the third electron beam A' for the first emission time t5, to thereby form the third shot pattern at the third shot area a' of the second region of the blank reticle 32. After an elapse of a first stopping time, the third electron beam B' may be again irradiated for a second emission time t6 and the next third shot area b' may be exposed to the third electron beam B' for the second emission time t6, to thereby form the next third shot pattern at the third shot area b' of the second region of the blank reticle 32. In the same way, the third electron beams C' and D' may be again irradiated for a third and fourth emission times t7 and t8 and the next third shot areas c' and d' may be exposed to the third electron beams C' and D' for the third and fourth emission times t7 and t8, to thereby form the third shot patterns at the third shot areas c' and d' of the second region of the blank reticle 32. The above-described processes may be repeated until all of the third shot areas may be sufficiently exposed to the respective third electron beams, respectively, to thereby form the third shot patterns in the second region 56 of the blank reticle 32.

Accordingly, the second region of the blank reticle 32 may be twice scanned by the second and the third electron beams and thus the photosensitive layer in the second region of the blank reticle 32 may be sufficiently exposed to the electron beams at the third shot areas a' to d' as well as the second shot areas a to d, thereby preventing the insufficient exposure of the marginal areas of the neighboring second shot areas a to d. In such a case, the photosensitive layer of the third shot areas a' to d' may also be sufficiently exposed to the electron beams by repeating the scan of the third electron beams on the third shot areas. The repetition quantity of the scans of the third electron beams may be individually determined at each third shot areas a' to d' of the blank reticle 32, and thus three or more scans of the third electron beams may be performed at a particular third shot area of the blank reticle 32.

Since the second the third electron beams may have cross-sectional areas larger than that of the first electron beams, the second shot patterns 54 and the third shot patterns may have larger sizes than that of the first shot patterns 50. Therefore, the number of beam scans may be decreased in the second region 56 compared with the first region 52, and thus the bulk pattern having no priority may be transcribed onto the second region 56 of blank reticle 32 for a shorter time than the fine pattern having a priority. In addition, the exposure process may be repeated once more on the boundary areas or the third shot areas between the neighboring second shot areas, thereby reducing the exposure failures at the marginal areas of the second shot patterns.

Thereafter, the photosensitive layer of the first shot patterns 50, the second shot patterns 54 and the third shot patterns may be developed by a development process, to thereby form first and second mask patterns on the first and the second regions of the blank reticle 32, respectively (block 1362). The first mask pattern may function as a mask pattern for forming the fine pattern on the blank reticle 32 and the second mask pattern may function as a mask pattern form forming the bulk pattern on the blank reticle 32.

The light shielding layer may be etched off using the first and the second mask patterns as an etching mask, and thus the fine pattern having a priority may be formed on the first region of the transparent reticle substrate and the bulk pattern having no priority may be formed on the second region of the transparent reticle substrate, respectively, thereby forming the reticle including the mother pattern of the fine pattern and the bulk pattern (block 1364).

According to some embodiments of the present inventive concept, the beam density and the size of the cross-sectional area of the electron beams for forming a mother pattern on the blank reticle may be changed in accordance with the size and priority of the mother pattern and thus the exposure time to the photosensitive layer may be reduced. Therefore, the process time for the formation of the reticle including the mother pattern may be reduced to thereby increase the efficiency for forming the reticle. That is, the reticle including the mother pattern in a photolithography process may be formed with low cost and short time.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a photolithography reticle, the method comprising:
   irradiating first electron beams having a first cross-sectional area onto a first region of a blank reticle that includes a light shielding layer and a photosensitive layer formed on a reticle substrate, the photosensitive layer of the first region being formed into first shot patterns;
   irradiating second electron beams having a second cross-sectional area that is larger than the first cross-sectional area onto a second region of the blank reticle, the photosensitive layer of the second region being formed into second shot patterns;
   developing the photosensitive layer to form a first mask pattern in the first region and a second mask pattern in the second region of the blank reticle; and
   etching the light shielding layer off from the reticle substrate using the first mask pattern and the second mask pattern as an etching mask to form a mother pattern including a first pattern having a first width in the first region and a second pattern having a second width in the second region, the first width being substantially smaller than the second width.

2. The method according to claim 1, further comprising adjusting an opening size of an aperture through which the first electron beams and the second electron beams are transmitted, wherein a first opening size corresponds to the first cross-sectional area and a second opening size that is larger than the first opening size corresponds to the second cross-sectional area.

3. The method according to claim 2, wherein adjusting the opening size of the aperture comprises moving at least one of a pair of first and second overlapping sections relative to one another.

4. The method according to claim 1, further comprising:

before irradiating the first electron beams onto the first region of the blank reticle, adjusting an opening size of an aperture through which the first electron beams transmit to a first size corresponding to the first cross-sectional area of the first electron beams; and before irradiating the second electron beams onto the second region of the blank reticle, adjusting the opening size of the aperture through which the second electron beams transmit to a second size that is larger than the first size corresponding to the second cross-sectional area of the second electron beams.

5. The method according to claim 3, wherein adjusting the opening of the aperture is performed by a pair of first and second sections relatively moving to partially overlap with each other.

6. The method according to claim 1, wherein the first and the second beams are periodically and intermittently irradiated for an emission time that occurs at an interval determined by a stopping time for which the irradiation of the first and second electron beams is stopped, so that the first and the second shot patterns are individually formed at each emission time.

7. The method according to claim 6, wherein the second electron beams are irradiated onto a larger shot area of the photosensitive layer than the first electron beams, so that the second shot patterns are formed to be larger than the first shot patterns.

8. The method according to claim 7, wherein the first pattern is transcribed into a fine pattern having the first width in a semiconductor device, wherein the second pattern is transcribed into a bulk pattern having the second width in the semiconductor device.

9. The method according to claim 8, wherein the first width is substantially smaller than the second width.

10. The method according to claim 1, wherein irradiating the first and the second electron beams is sequentially performed on a whole area of the first and the second regions of the blank reticle, respectively, to complete a beam scan of the first and the second electron beams onto the first and the second regions, respectively.

11. The method according to claim 10, wherein the beam scan of the first and the second electron beams is repeated without changes of exposure conditions.

12. The method according to claim 10, after completing the beam scan of the second electron beams on the second region of the blank reticle, further comprising:

irradiating third electron beams onto marginal portions of the second shot patterns, thereby forming third shot patterns covering marginal portions of the neighboring second shot patterns.

13. The method according to claim 12, wherein the third electron beams have a third cross-sectional area that is substantially identical to the second cross-sectional area, and wherein the second electron beams and the third electron beams include substantially the same beam intensities and beam intensity uniformity.

14. The method according to claim 1, wherein an intensity uniformity of the second electron beams is less than that of the first electron beams.

* * * * *